(12) United States Patent
Sutton et al.

(10) Patent No.: US 6,839,650 B2
(45) Date of Patent: Jan. 4, 2005

(54) ELECTRONIC TEST SYSTEM AND METHOD

(75) Inventors: Christopher K Sutton, Everett, WA (US); William R Pritchard, Marysville, WA (US); Kirsten C Carlson, Snohomish, WA (US); James Martin, Marysville, WA (US)

(73) Assignee: Agilent Technologies, Inc., Palo Alto, CA (US)

( * ) Notice: Subject to any disclaimer, the term of this patent is extended or adjusted under 35 U.S.C. 154(b) by 57 days.

(21) Appl. No.: 09/992,224

(22) Filed: Nov. 19, 2001

(65) Prior Publication Data

US 2003/0097233 A1 May 22, 2003

(51) Int. Cl.[7] .............................................. G06F 19/00
(52) U.S. Cl. ..................................................... 702/123
(58) Field of Search ............................. 702/123, 117; 714/724, 718, 25, 738, 30, 4; 438/4; 700/17; 310/339, 268; 318/141; 322/1, 22; 290/1; 360/96.3; 600/300; 345/853; 365/201; 716/5; 370/396

(56) References Cited

U.S. PATENT DOCUMENTS

| | | | |
|---|---|---|---|
| 5,206,582 A | | 4/1993 | Ekstedt et al. |
| 6,094,733 A | * | 7/2000 | Momohara .................. 714/718 |
| 6,128,759 A | * | 10/2000 | Hansen ........................ 714/738 |
| 6,349,392 B1 | * | 2/2002 | Swoboda et al. ............. 714/30 |
| 6,360,332 B1 | * | 3/2002 | Weinberg et al. ............... 714/4 |
| 6,449,744 B1 | * | 9/2002 | Hansen ........................ 714/738 |
| 2003/0078679 A1 | * | 4/2003 | Sutton .......................... 700/17 |
| 2003/0093736 A1 | * | 5/2003 | Grey ........................... 714/738 |

FOREIGN PATENT DOCUMENTS

| | | |
|---|---|---|
| EP | 1 308 737 | 5/2003 |
| WO | WO 99/47937 | 9/1999 |

OTHER PUBLICATIONS

XP002259312, Klinger, Motti, "Reusable Test Executive and Test Programs Methodology and Implementation Comparison Between HP Vee and Labview", Proceedings of the Autotestcon 1999, IEEE, Aug. 30, 1999–Sep. 2, 1999, pp. 305–312, p. 307, col. 1, paragraph1–col. 2, last paragraph; p. 305, col. 1, paragraph 2–p. 306, col. 2, last paragraph.

Thompson, Kirk D., "COM–Based Test Foundation Framework", Autotestcon '99, IEEE Systems Readiness Technology Conference, 1999, IEEE San Antonio, TX, USA Aug. 30–Sep. 2, 1999, Piscataway, NJ, USA, IEEE, US, Aug. 30, 1999, pp. 19–25, XP010356126, ISBN: 0–7803–5432–X; Figures 1, 2; p. 19, col. 2, paragraph 2—p. 21, col. 1, paragraph 1; p. 22, col. 1, paragraph 1–col. 2, paragraph 2.

Fertitta, K. G. et al, "The Role of Activex and COM in ATE", Autotestcon '99. IEEE Systems Readiness Technology Conference, 1999, IEEE San Antonion, TX, USA Aug. 30–Sep. 2, 1999, Piscataway, NJ, USA, IEEE, US, Aug. 30, 1999, pp. 35–51, XP010356128, ISBN: 0–7803–5432–X, p. 35, col. 2, paragraph 4–p. 40, col. 2, paragraph 8.

National Instruments, "TestStand—A Complete Test Executive Environment," National Instruments, pp. 55–60 (Mar., 2000).

* cited by examiner

Primary Examiner—John Barlow
Assistant Examiner—Tung Lau
(74) Attorney, Agent, or Firm—June L. Bouscaren

(57) ABSTRACT

An electronic test system having an object oriented hierarchical infrastructure including classes that allow a test developer or a test user to design a desired electronic test system. The class relationships define the function of the electronic test system. Classes include a procedure class, a test class, a measurement class, a datapoint class, a parameter class, a DUT class, a test system class, a specification class, a run procedure class, a result class, a plug-in class, an exec class, a model class, a device class, a test system device class, a user menu item class, an application class, and a state class. These classes are implemented in a hierarchical structure in which a datapoint is a subset of a measurement, a measurement is a configuration for a test, a test is a group of measurements that share the same test algorithm, and a procedure is an ordered list of tests to be run, and includes a list of measurements and datapoints.

24 Claims, 8 Drawing Sheets

ELECTRONIC TEST SYSTEM AND METHOD

BACKGROUND OF THE INVENTION

1. Field of the Invention

The present invention pertains to the field of testing complex electronic product devices over many phases of the products life cycle.

2. Statement of the Problem

Test systems are used to test complex electronic product devices over many phases of the product's life cycle which include test development, qualification testing, and manufacturing testing. These complex electronic product devices are tested for many independent parameters and are part of many different model families. Due to the large number of different products, different parameters to be tested and product model families, a test engineer is tasked with constantly modifying the test system without errantly causing the test system to become inoperative due to misplaced modifications or code. In addition, prior art test programs have lacked a common uniform operator interface when operating within these different manufacturing environments and different model families.

Prior art test programs are difficult to design tests for because a test engineer has to focus on the whole test when designing or modifying the individual parts of a test program, such as individual tests, tests lists or test algorithms. In prior art systems, test procedures are incorporated into the test algorithms, thereby making the test algorithm susceptible to errantly entered commands while modifying a test procedure. Further, a test engineer must consider the interactions between a test, lists of tests, test algorithms and the test system. Additionally, whenever the test engineer has to modify a test, he must consider the interactions with the whole system.

In addition, test sequencing can be rigid and inflexible when using test systems designed with large bulky test algorithms incorporated into structured programs. This increases the time a test engineer spends on rewriting or debugging the test system algorithms due to inerrant test procedure modifications or entries. In addition, portions of a test cannot be easily reused by a test engineer because they are written into a larger structured program. This inability to reuse test system code increases time rewriting or reentering new non-reusable test system code.

Another problem faced by test engineers in testing electronic product devices is that they must interface with other manufacturing systems. They often must incorporate a variety of software languages in designing test systems that interface with the electronic product device, the output devices and remote test initiation and monitoring devices. Test designs for these varying devices and systems often need to be developed in different software languages, some obsolete, to incorporate all of the different devices and systems of the test system. Test engineers are also faced with the difficulty of running the test system on unsupported and nonstandard operating systems that present a non functional interface system to the test engineer.

3. Solution to the Problem

The present invention advances the art and helps to overcome the aforementioned problems by providing a hierarchical test system that allows the test designer to modify an individual device and its associated test parameters in individual modules or objects. This allows a test engineer to modify and create the test device parameter objects without affecting the test systems algorithms. The objects are functionally predetermined to interact with the test system through an object interface in a predetermined manner, with good certainty that they will not interact in undocumented ways. This permits each of the objects to be reused in different programs and to be easily modified without affecting parts of the program external to the object.

The definition of the hierarchical levels and assigning an object to each hierarchical level results in the test engineer being able to break down a complex test into manageable units that can be separately considered and the interaction of which can be easily understood. The invention preferably contains a four-level hierarchical system, preferably including the following levels: Procedure, Test, Measurement and Datapoint. The hierarchy is one in which each lower level is a subset of the next higher level. The hierarchy is implemented in the software as a tree of four objects, each of which maps to one of the hierarchical levels. Interactions of the objects are governed by pointers which reflect relationships between hierarchical levels. The invention makes test development and maintenance more efficient because the test procedure data is consistently organized in a logical fashion and is separate from the test algorithm.

The invention preferably contains pure virtual base classes that define the interface between the electronic test system and test software. Actual test software and code component plug-ins are derived from these base classes. By referencing these base classes by Virtual Basic™ test software projects and plug-in projects, the base classes themselves will remain free from unwanted file modification or corruption. This also allows the electronic test system, test software and plug-ins to be revised without affecting each other. This also protects against unwanted and errant code being written during design and modification of new or existing test procedures.

To achieve desired climatic testing conditions for the electronic devices, in one aspect, the invention preferably includes an enclosed testing environment. This enclosed testing environment contains a temperature device and a humidity device, capable of achieving desired climatic testing conditions. The temperature device and humidity device are adapted to communicate with a chamber driver. The chamber driver is adapted to communicate with the processor of the electronic testing device. The test developer can instantly modify temperature and humidity settings for testing the electronic devices under test by changing temperature and humidity settings in the electronic test system. The enclosed testing environment allows the test developer to test electronic devices within a temperature controlled and humidity controlled environment. The enclosed testing environment is capable of containing a plurality of electronic devices under test. The plurality of electronic devices under test are adapted to communicate with the electronic test system while in the enclosed testing environment.

The electronic test system preferably is designed to be controlled automatically and remotely from another program, such as a manufacturing process controller or an environmental test profile controller. Test developers and test users can modify test procedures and execute the invention from different areas of the production and manufacturing processes. The electronic test system is designed with a common and popular programming language to help ensure common and uniform development and modification throughout the manufacturing and production process and between its various users and developers.

The invention provides an electronic test system for testing an electronic device under test (DUT), the test system comprising: an electronic processor; an electronic memory coupled to the electronic processor; a hierarchical program structure residing in the memory and executed by the processor, the hierarchical program structure having multiple levels including a measurement level corresponding to a measurement to be performed on the DUT, a test level corresponding to one or more of the measurements, and a procedure level corresponding to an ordered list of the tests to be performed on the DUT. Preferably, the hierarchical program structure further includes a datapoint level corresponding to a single result of a measurement, and the measurement level includes a plurality of the datapoints.

In another aspect, the invention provides an electronic test system for testing an electronic device under test (DUT), the test system comprising: an electronic processor; an electronic memory coupled to the electronic processor; a hierarchical program structure residing in the memory and executed by the processor, the hierarchical program structure having multiple levels including a measurement level corresponding to a measurement to be performed on the DUT, a test level corresponding to one or more of the measurements, and a procedure level corresponding to an ordered list of the tests to be performed on the DUT, each level embodied in the electronic test system as a software object. Preferably, the hierarchical program structure further includes a datapoint level, and the measurement level corresponds to a group of datapoints, the datapoint level embodied in the electronic test system as a datapoint software object. Preferably, the hierarchical program structure further includes a product model level corresponding to a set of procedures for testing a family of the DUT. Preferably, the set of procedures in the product model level are stored in a DLL file. Preferably, the procedure object comprises a structure of component object model (COM) objects. Preferably, the test object defines a test algorithm. Preferably, the test algorithm comprises one or more electronic operations defined by software code, and the electronic parameters for the electronic functions are provided by the measurement object. Preferably, the test object contains the measurement object, and the measurement object contains the datapoint object.

The invention also provides an electronic test system comprising: an electronic processor; an electronic memory coupled to the electronic processor; a hierarchical structure residing in the memory and executed by the processor, the hierarchical structure having multiple levels, each level embodied in the electronic test system as an object defined by a class, wherein the implementation of the object is defined by the user of the hierarchical structure by implementing the class; the classes including a measurement class corresponding to a measurement to be performed on the device, a test class corresponding to one or more related measurements, and a procedure class corresponding to an ordered list of tests to be performed on the device. Preferably, the hierarchical structure further includes a datapoint class linked to the measurement class. Preferably, the electronic test system further comprises: a test software class, the test software class defining: a test software object and a set of object methods, the set of object methods defining: an object method that displays information to a user of the apparatus, an object method that is responsive to changes in the test software and is capable of creating the procedure object, an object method capable of creating the test object, the measurement object, and the datapoint object, and an object method capable of beginning and ending a selected procedure. Preferably, the electronic test system further comprises: a software object method capable of beginning and ending the procedure, and a software object method capable of beginning and ending the test. Preferably, the electronic test system further comprises: a chamber driver residing in the memory, the chamber driver capable of controlling a temperature output device and a humidity output device. Preferably, the electronic processor further is adapted for electronically communicating with the DUT for executing the test software on the DUT and receiving a plurality of electronic outputs from the DUT corresponding to the measurement objects and the datapoint objects. Preferably, the electronic test system further comprises a manual input device communicating with the processor, the manual input device selected from the group consisting of a keyboard, a knob, a spin control, a mouse, a joy stick, a touch pad, and a roller ball. Preferably, the electronic test system further comprises plug-in software code components residing in the memory and providing an interface to other systems. Preferably, the electronic test system further comprises a COM control interface residing in the memory permitting the test system to be initiated and monitored from other systems. Preferably, the COM control interface comprises an ActiveX™ COM interface.

The invention also provides a method for producing an electronic test system software program for testing an electronic device under test (DUT), the program including a hierarchical structure having multiple levels including a measurement level corresponding to a measurement to be performed on the DUT, a test level corresponding to one or more of the measurements, and a procedure level corresponding to an ordered list of the tests to be performed on the DUT, each level embodied in the program as a software object for testing a device under test (DUT), the method comprising the steps of: providing a set of functions wherein the implementation of the functions is defined by the hierarchical structure; implementing the functions to define the test system software program; generating the electronic test system software objects by executing the functions; and utilizing the software objects to test the DUT. Preferably, the hierarchical structure further includes a datapoint level which is a subset of the measurement level.

The invention also provides a computer-readable medium on which is stored a program for testing an electronic device under test (DUT), the computer program comprising: a measurement software object corresponding to a measurement to be performed on the DUT; a test software object defining a test algorithm utilizing parameters provided by the measurement object and corresponding to a test to be performed on the DUT; a procedure software object corresponding to an ordered list of the tests to be performed on the DUT; and a plurality of software pointers linking the measurement object, the test object and the procedure object. Preferably, the computer-readable medium further includes a datapoint object linked to the measurement object.

In another aspect, the invention provides an electronic test system for testing a device under test (DUT), the test system comprising: an electronic processor; an electronic memory coupled to the electronic processor; a procedure residing in the memory and executed by the processor, the procedure embodied in the electronic test system as a software object for testing a device under test (DUT), wherein the procedure comprises: a function defined by a class, wherein the implementation of the function is defined by the user of the test system by implementing the class; the procedure object including: a first set of software object methods in the procedure object to perform a plurality of predetermined functions to implement the procedure object. Preferably, the electronic test system further comprises: a test class defining a test object corresponding to a test to be performed on the DUT, a second set of object methods for creating the test; and the procedure object containing the test object.

The system also provides a method for producing an electronic test program in which the test procedure is separate from the test algorithm, the method comprising the steps of: providing a software storage medium containing an object oriented program including: software code implementing the test algorithm in a test class defining software object methods; a set of functions defining the procedure; implementing the functions to produce classes to further define the procedure; and generating the test procedure separate from the test class defined object methods by implementing the functions to provide a list of tests to be run and a list of measurements which provide parameters for each of the tests.

The invention not only provides relatively-easy means to modify an existing test procedure or create a new test procedure, but it preferably also organizes the test results in a logical, intuitive, and visually appealing way enabling the test developer to instantly determine the test results. The invention preferably compares the test results with a set of user-defined specifications, and assigns a resultant icon based on the comparison. This resultant icon is logically and efficiently displayed and allows the test developer to instantly recognize passing and failing test results. In addition, the visual presentation of the resulting icons and the test results allow the test developer or user to conceptualize modifications and improvements.

The above and other advantages of the present invention may be better understood from a reading of the following description of the preferred exemplary embodiments of the invention taken in conjunction with the drawings in which:

DETAILED DESCRIPTION OF THE PREFERRED EMBODIMENT

Overview

The present invention provides a method and apparatus to efficiently test complex electronic devices that require many parametric measurements. Here, "efficiently test" includes not only an efficient design of a particular test, but also includes efficiency in redesigning tests when evaluating devices over many phases of a device's life cycle, including test development, qualification testing and manufacturing testing. During qualification testing, the invention provides a consistent programmatic interface for qualification test supervisor programs. During manufacturing testing, the invention provides a common interface for multiple products, and helps maximize test productivity.

Figure 1:
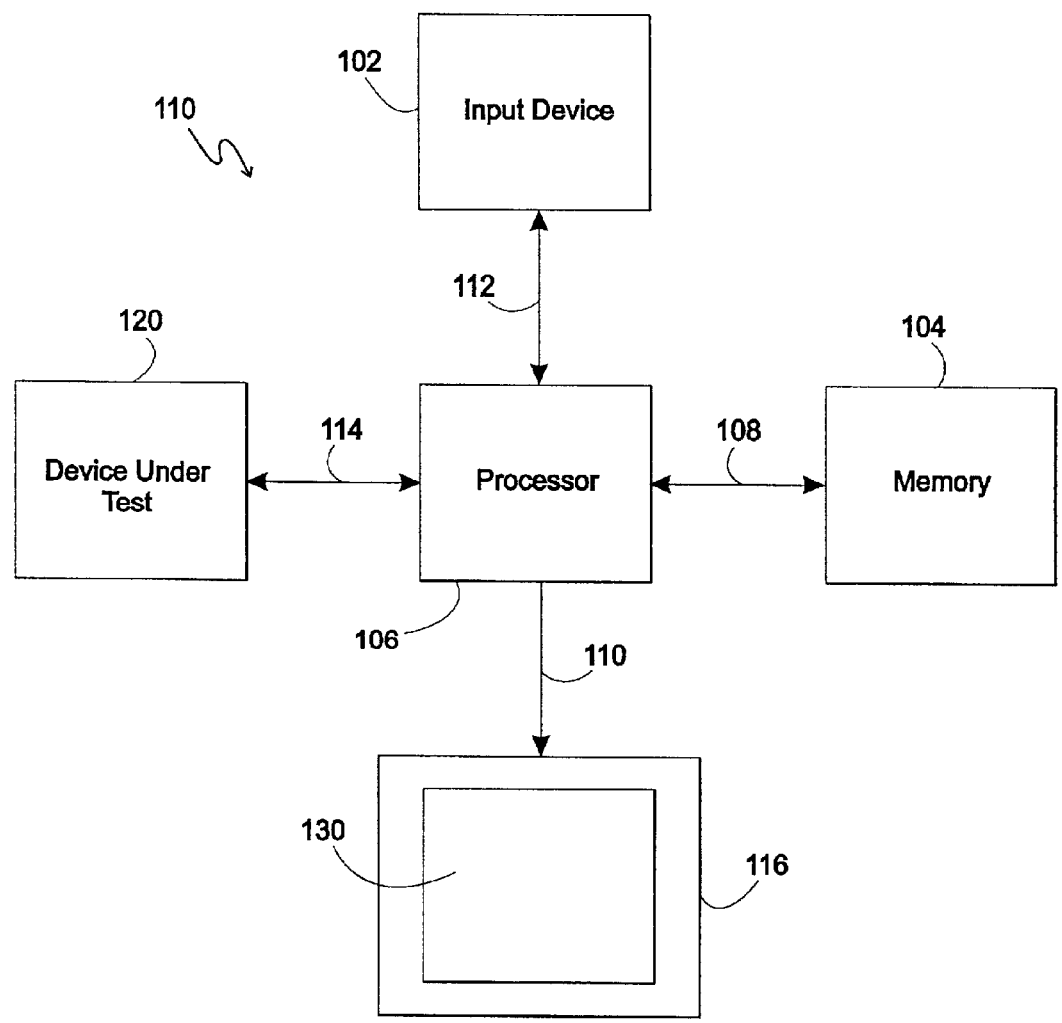
FIG. 1 is a block diagram of the principal hardware components of the preferred embodiment of the present invention connected to a device under test (DUT)

FIG. 1 is a block diagram illustrating a generalized electronic test system 100 in which the present invention is implemented. FIG. 1 includes a manual input system 102, a memory 104, a video display system 116, an electronic processor 106, and a device under test (DUT) 120. Memory 104 contains object oriented hierarchical software instructions which embody the method of the invention, and which will be described in detail below. The DUT 120 communicates with processor 106 over path 114. The interaction of the processor 106 with the DUT 120 is shown in more detail in FIG. 2, which will be discussed below. Processor 106 reads from and writes to memory 104 over path 108. Input system 102 sends input signals to processor 106 over path 112. Responsive to the signals from the DUT 120, and input device 102, and under control of an object oriented hierarchical software program stored in memory 104, processor 106 generates electronic information signals and sends the signals to video display system 116 over path 110 to visually display information in a graphical user interface format on screen 130, which is shown in FIG. 3 and will be discussed in detail below.

Figure 2:
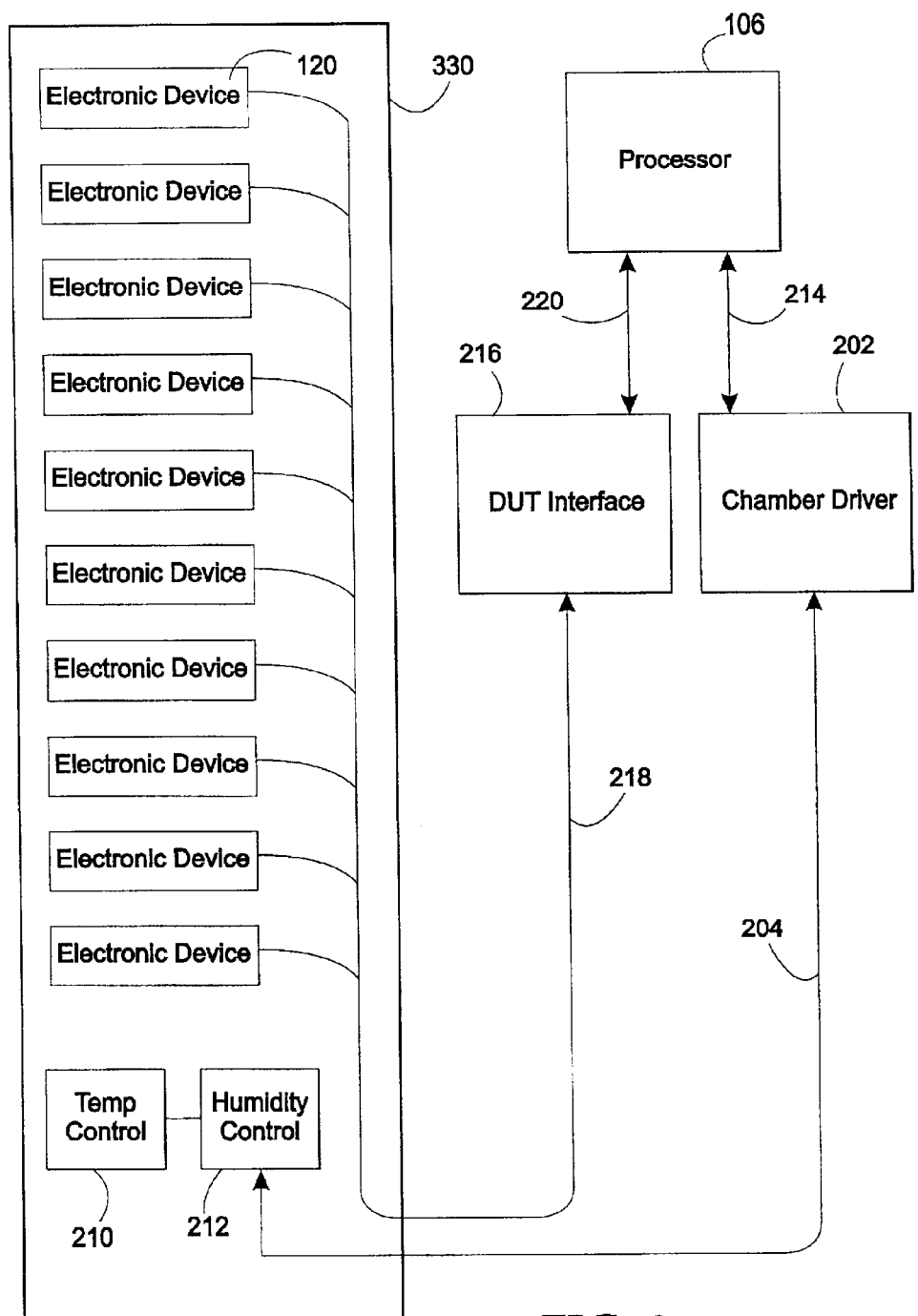
FIG. 2 is a block diagram illustrating the connection of the processor of FIG. 1 to the DUT.
Figure 3:
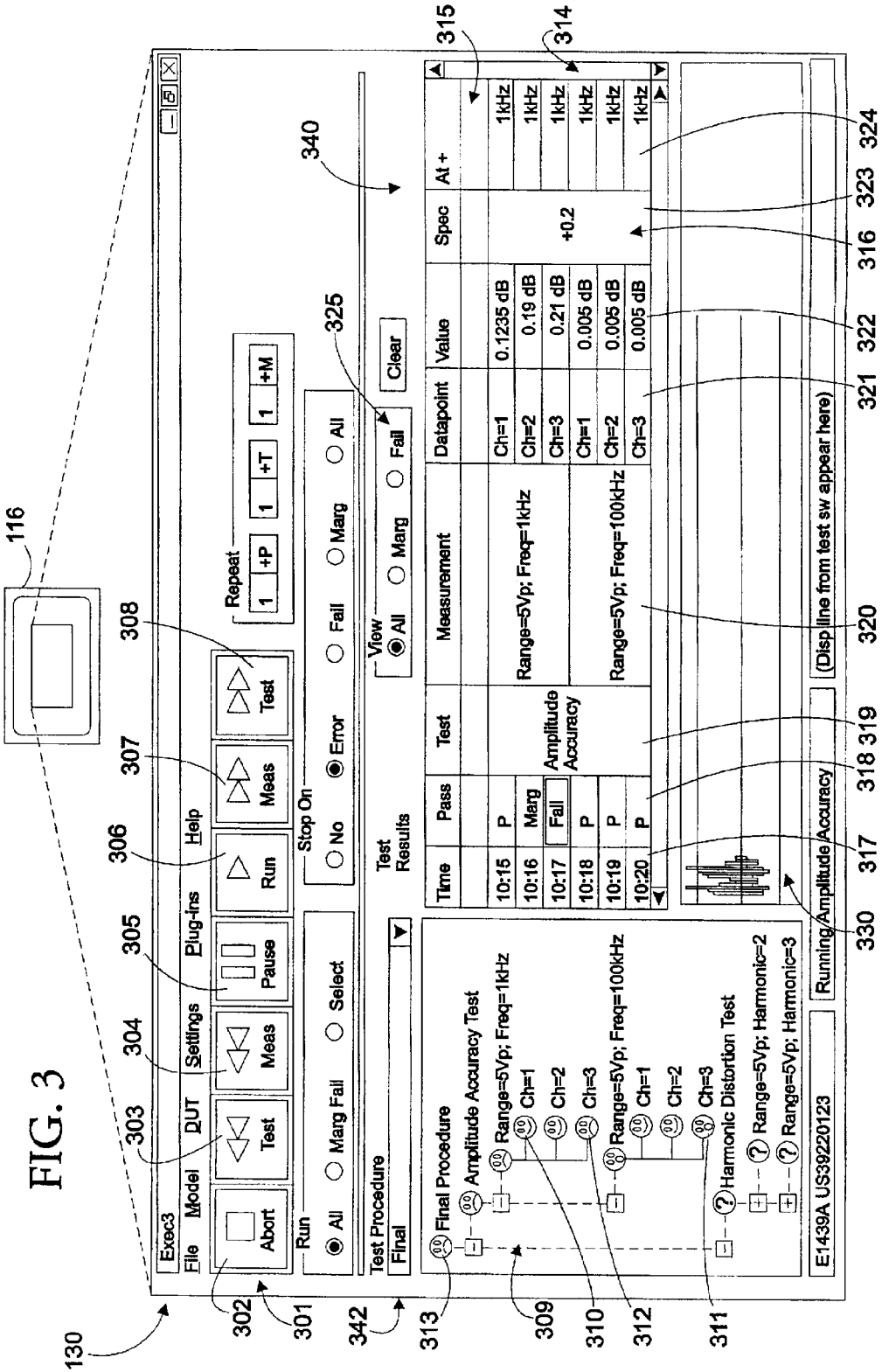
FIG. 3 is a screen display generated according to the preferred embodiment of the invention.

FIG. 2 illustrates an example of a DUT 120 controlled by a processor 106. Processor 106 is connected to a chamber driver 202 through a pathway 214. The chamber driver 202 is adapted to communicate temperature and humidity values to a temperature control device 210 and a humidity control device 212, respectively, through pathway 204. Temperature control device 210 and humidity control device 212 are contained within an enclosed testing environment 330. Also within the enclosed testing environment are the electronic devices, such as 120, to be tested. The DUT interface 216 is adapted to communicate with the electronic devices 120 that are contained within the enclosed testing environment 330 through pathway 218, and the DUT interface 216 is adapted to communicate with the processor 106 through pathway 220.

The software program according to the invention is illustrated in FIGS. 4 through 8, which will be discussed below. A key aspect of the program according to the invention is that it is hierarchical; that is, it includes multiple levels, with each level branching to lower levels which it contains. Preferably, the hierarchy is a four-level hierarchy including the following levels: procedure, test, measurement and datapoint. A procedure is an ordered list of tests and have names like "Turn-on", "Final Sales", and "Environmental". At test is a group of measurements in a procedure that share the same test algorithm, and thus the same software code. Tests have names like "Amplitude Accuracy" and "Harmonic Distortion". A measurement is a configuration or setup for a test, and provides parameters to a test. Measurements have names like "Range=10 volts", "Frequency=100 kHz", and "Harmonic=3". A datapoint is a subset of a measurement containing additional parameters that select a result when one measurement generates multiple results. Datapoints have names like "Channel=1" and "Peak". The hierarchy is preferably implemented in the software as a tree of four objects, each of which maps to one of the hierarchical levels. Interactions of the objects are governed by pointers which reflect relationships between hierarchical levels.

Before embarking on the detailed discussion of the invention, it would be helpful to define terms which will be used in this discussion. The term test software herein means the code components provided by a test developer to test a specific product. The term manufacturing system means the electronic test system manufacturing processes. The term graphical user interface means an input device that allows the user to manipulate and execute the invention by pointing and clicking on icons displayed on the invention. The term input device means a keyboard, knobs, spin controls, mouses, joy sticks, touch pads, roller balls, or other conventional input devices. The term string means a data structure composed of characters, usually in human-readable text.

The term component object model (COM) means component architecture independent and platform independent computer language that is meant to be a general purpose, object-oriented means to encapsulate commonly used functions and services. The COM defines the name, return type and parameters of the interface's methods. The term objects is a specific instance of a set of functions or methods collected into interfaces and each object has data associated with it. Methods are the action that a message carries out, the code which gets executed when the message is sent to a particular object. All communications to objects are done via messages. Messages define the interface to the object. Classes define what it is to be an object. Creating an object from a class means to have created an instance of the class. The instances of the class are the actual objects. Classes are the blueprint of an object. Objects are unique individual instances of a particular class. The term interfaces means a defined collection of properties and methods that can be implemented by a class. The interface is essentially a table of pointers to the functions that make up the interface. Pointers are an indirect reference to data or code, analogous to an address. Each interface under COM is numerically unique. A class can be derived from one or more other classes; this is known as inheritance.

COM supports interface inheritance, meaning the interface may be derived from another interface, inheriting the base interface's binary signature. The combination of the name and parameter of a method is usually called its signature. Delegation means the derived object creating or instantiating an instance of the base object. The derived object contains code for new behaviors and methods that are over-ridden, and serves as a pass through for those method calls that are unchanged. The term plug-in means a program of data that improves or furthers the operation of the invention. The invention plug-ins are code components that allow the invention to be interfaced to other systems, such as a database or equipment calibration verification system. The term computer platform means a software operating system and/or open hardware such as Windows™ NT™ application. The term dynamic link library (DLL) means an executable code module for computer platforms that can be loaded on demand and linked at run time and then unloaded when the code is no longer needed. Test software and plug-ins code are contained in DLL files, so they can be developed and delivered independently.

The invention also provides a consistent software interface to the manufacturing systems. The invention provides a standardized software interface for the test developer. The standardized software enables the test developer to perform the tasks of sequencing tests, displaying and logging results, and interfacing with other manufacturing systems.

The invention is designed to run on readily available computer platforms and standard, preferred, supported and easily networked operating systems. The invention uses a graphical user interface that allows the user to select a specific product model to be tested, enter configuration information, select and edit a test procedure, start test and control test execution (pause, continue, repeat, abort . . . ), and view the test results. Controlling the test execution is accomplished through clicking on the tape recorder button icons on the display. The invention has well-defined component object model (COM) interfaces to test software and the invention plug-ins. This includes tests, test procedures, and test system drivers.

A feature of the invention is that the electronic test system 100 can be remotely controlled and can be initiated and monitored from other programs through the use of its ActiveX™ COM interface. The invention's COM interface includes an object model that aids in test and procedure organization. The invention encourages efficient and accurate test routine development through the use of parameters designed specifically by the test developer. Also, because of the object nature of the invention, parameters can be easily modified and reused for new test procedures, without generating extra parameters for the new test procedures.

DETAILED DESCRIPTION

The software program according to the invention is most easily developed utilizing the Visual Basic™ programming language, which is a productive, efficient and current programming language. This standard programming language enables test developers to easily and efficiently construct complex test procedures. The invention is designed to interface through modular interconnections to a variety of systems including: test results databases and calibration and tracking systems. The programming language allows development in a Windows™ environment.

FIG. 3 shows a graphical user interface (GUI) screen 130 as displayed on the output device 116. The "tape recorder" type buttons 301 on the top left are used to control the test. From left to right, the buttons are: abort 302, restart test 303, restart measurement 304, pause 305, run 306, skip measurement 307, skip test 308.

The right side 314 of the graphical user interface 130 shows a window 340 comprising a series of rows, such as 315, and columns, such as 316, displaying the test results in an alphanumeric format. Window 340 also displays the time 317 the test is run, as well as the status of the test 318. This window displays the test that is being carried out, such as amplitude accuracy in 319, the type of measurement, such as (range=5 Vp, Frequency=1 kHz) in 320, the datapoint or channel under test, such as (Ch=1, Ch=2, Ch=3) in 321, the value or result of the measurement, such as (0.1235 dB) in 322, the specification, such as (±0.2) in 323, and the frequency, such as (1 kHz) in 324. The test can be sorted by clicking in the view window 325 above the window 340. This allows either all the test results to be displayed, or permits the results to be filtered and displayed depending on their marginal or failed status. The bottom right window 330 is a progress window indicating the progress of the test procedure.

On the left side of the graphical user interface 130, the preferred embodiment of a tree window 309 according to the present invention is shown. In window 309, the test results are displayed in a manner reflecting the hierarchical structure of the test. Window 309 includes a hierarchy of procedures, tests, measurements, and datapoints. Icons corresponding to the results indicate pass, fail, marginal, and not-yet-tested. "Smiling" 310, "surprised" 311, and "sad" 312 icons correspond respectively to the pass, marginal, and fail status. The pass/fail icon 313 on top of the window is for the entire procedure. It summarizes the status of all the tests with "fail" having priority. That is, if there is one failed test, the whole procedure is fail. The Boolean operator "AND" is used to compute the final status of the procedure.

Figure 4:
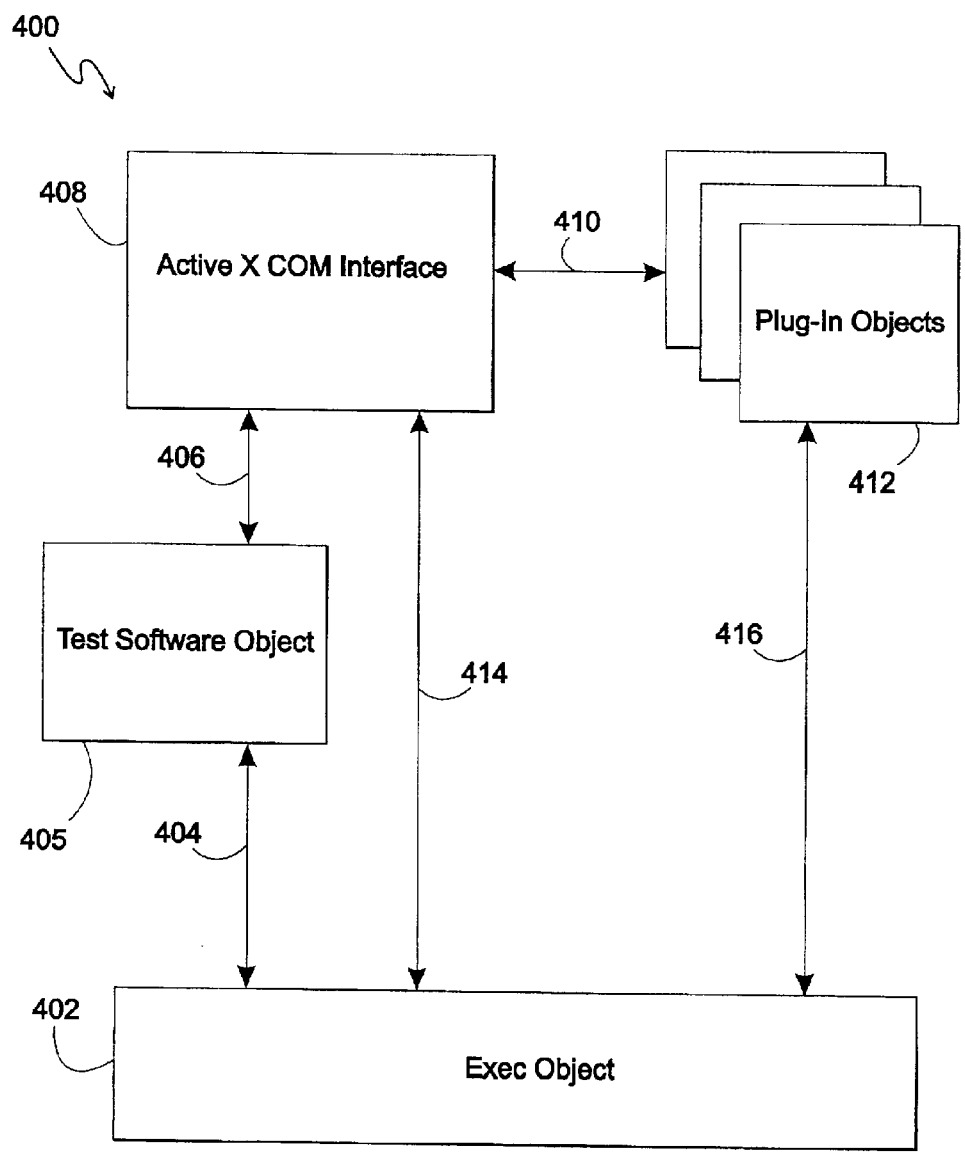
FIG. 4 is a block diagram of the test system and related interface objects.
Figure 5:
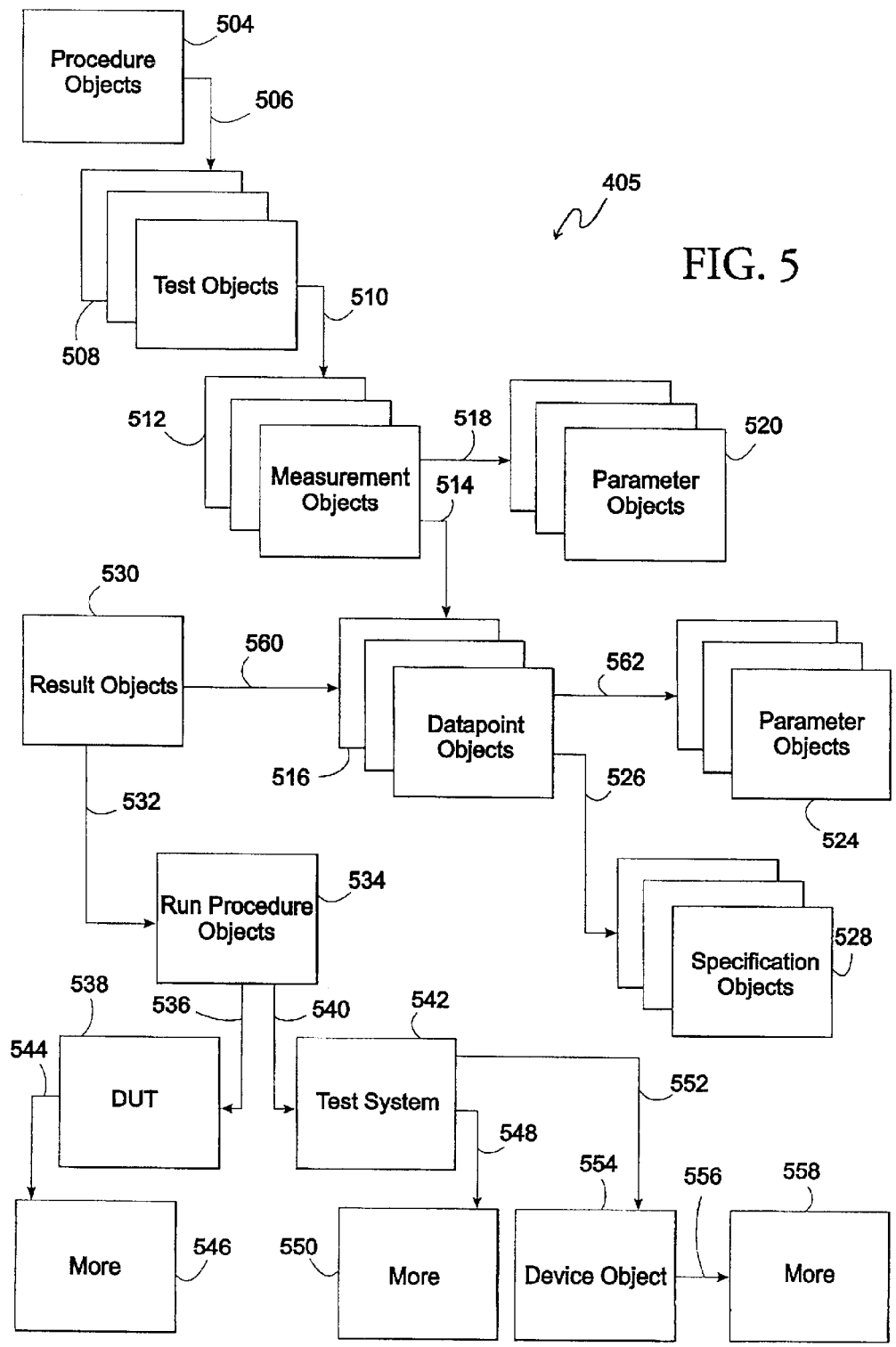
FIG. 5 is a block diagram of the hierarchy of the test software components.

FIG. 4 is a block diagram of the preferred embodiment of a test software program 400 according to the invention, while FIG. 5 is a block diagram of the hierarchy of the test software components. Features designated with a four hundred series numeral are shown in FIG. 4, while features designated with a five hundred series numeral are shown in FIG. 5. The program includes an ActiveX™ COM interface 408 that communicates to plug-in objects 412 through pathway 410. The plug-in objects 412 contain a name string of the plug-in and this appears in the invention's tools menu. It also contains a show method that the electronic test system 100 will call when the user clicks the menu item for the plug-in. In addition, the plug-in objects 412 contain a plug-in initialization method and a plug-in de-initialization method that the electronic test system 100 calls when a plug-in is loaded and unloaded. Also, the plug-in objects 412 contain a procedure initialization method and procedure de-initialization method that the electronic test system 100 will call when beginning a test procedure and ending a test procedure. The plug-in method is called after the test software method so test system device information can be passed from the test software to the plug-ins. The plug-in objects 412 also contain a test initialization method and a test de-initialization method that the invention will call when beginning and ending a test. The plug-in objects 412 further contain a result post method that is called each time the test software returns a new datapoint result to the invention, after it has been evaluated to a specification object 528 (FIG. 5).

An exec object 402 is passed across almost all the invention's interfaces. It allows test software objects 405 and plug-ins objects 412 to check the state of the invention's user interface settings. The exec object 402 also has "callback" methods for tasks like posting datapoint results and waiting. The exec object 402 contains a Boolean value for being controlled by its ActiveX™ interface 408. Test software objects 405 can use this property to avoid user instructions, which would otherwise stop the test procedure. Also, the exec object 402 contains a comment string for the test operator. There is a reference to the current DUT object 538 and a reference to the invention's main form object, which is useful when displaying other forms. An exec object 402 contains the current measurement object 512. In addition, an exec object 402 contains a measure abort Boolean value that will be set to true if the user has pressed the Restart/Skip Test/Meas tape recorder buttons 301 on the visual display 130. Test software can set it true to cause the current measurement to be aborted and skipped.

The exec object 402 also contains the model string which is the specific DUT model number currently being tested. This string is one of the choices in the DUT entry form and one of the strings added to the Models collection in the test software initialization object. The exec object 402 also contains a model family string for the currently loaded test software. This string appears in the invention's "Model Family" drop down menu list. There is a one-to-one correspondence between the model family and test software objects 405. The exec object 402 further contains a collection of strings, one for each specific model in the model family. This list appears as choices in the DUT entry form. In addition, the exec object 402 contains the test operator employee number as a string and the current procedure object 504 and the collection of all procedures. The exec object 402 also contains a Boolean value that will be true if the test operator has pressed the Abort tape recorder button 302. Test software objects 405 can set it true to cause the invention to abort a procedure.

The exec object 402 also contains the current procedure to run object 534. The invention creates a new run procedure object 534 each time a procedure is started. It stores a snapshot of information like start time and temperature of the device being tested. The run procedure object 534 also has properties that are updated during the run procedure like pass/fail summary and failed datapoint count. Further contained in the exec object 402 is a qualification test as a string, such as "Humidity" and the region within a qualification test. In addition, the exec object 402 contains the directory path and file name for the current comma-separated-value (CSV) results file. Also, the exec object 402 selects production and customer specifications and contains variants like temperature in degrees and relative humidity. An exec object 402 will also contain a file name for the currently loaded test software, such as "TestSwE1432" not including the directory or suffixes such as ".DLL" or ".EXE." There is a one-to-one correspondence between the model family and the test software objects 405. The exec object 402 also contains the current test object 508.

An exec object 402 contains a display method which is called to display one line of text in the status bar area of the invention's main form. The display method may raise a special error if the test operator has pressed the Abort/Skip/Restart tape recorder buttons 301. An exec object 402 contains a get exec setting string where the string returns an item from the invention's initialization configuration file. In addition, the exec object 402 contains a method for calling a dialog box to a display. Text may be multiple lines. Text may be plain text or HTML. For text that starts with "file:", "http:", "https:" or "ftp:", the exec object 402 will assume that text points to a Web page and will display the page in a browser. If text starts with "<HTML>", the exec object 402 will assume the entire string is HTML and display it in a browser. The exec object 402 will display the message box along with tape recorder buttons that are appropriate for the current state, such as "Continue Running", "Abort", "Skip Meas", "Skip Test" or "Print". If a test is not running, the exec object 402 will only display "OK" and "Print" buttons.

An exec object 402 also contains a result post method called by a test to return a datapoint result 530 to the exec object 402. The value is the measured value. The results post method also contains the enumerated constants result type which tells the exec object 402 how to handle the datapoint result 530, whether to report it as a normal result and compare to a specification object 528 and record, or whether to treat it as an error, or as not applicable, or as a note. An exec object 402 also contains a wait method that is called to wait a specific time in seconds. During the wait, the invention processes user interface events. A wait may raise a special error, measurement abort, to signal that a measurement has been aborted. This will occur if the user presses the Skip/Re-start tape recorder buttons 306 and 303 during a measurement.

A CSV interface can be implemented by several exec objects 402. The purpose of the CSV interface is to give objects persistence by defining some methods to allow the properties to be written to a file and then read back. Also, CSV files are compatible with spreadsheet programs. A CSV interface contains a heading that is a read-only property that returns a heading line consisting of the names of the object's properties separated by commas. The CSV interface also contains a CSV string that, when evaluated, returns a line consisting of a list of values, one for each property, separated by commas. When assigned a value, it expects to parse a string and assign property values.

A user menu interface allows the test developer to provide context menus for the procedure view in the invention's user interface. The user menu interface contains a get menu items method that the invention will call when the user right clicks on a test in procedure view. The parameters can be used to determine which item in procedure view was clicked. Also, the user menu interface contains a method that the invention will call when one of the user menu items specified by the get menus items is clicked. The parameters will be the same as in the most recent get menu items call, with the addition of the menu text parameter, which indicates which menu item was clicked.

A user menu item object specifies the text and other properties of a menu item added to the procedure view context menu. The user menu item object contains a text string that will be added to the menu. In addition, the user menu item object contains a ghosted Boolean value that, if set to true, the menu item will appear ghosted and the user will not be able to select it. Further, the user menu item object contains a checked Boolean value that, if set to true, a check mark will appear next to the menu item.

The main/root object of the invention's ActiveX™ interface is its application object. Instantiating this object will start the invention's application executable file. The application object contains a model family string which is the name of the test software, as listed in the invention's configuration initialization file and so on the invention's "Model" menu. Setting it will cause the invention to load new test software. Also contained in the application object is the name of the active test procedure. Setting it will cause the invention to load and expand a test procedure. The application object also contains a reference to a DUT object. After changing the DUT parameters through this interface, the DUT valid method should be set true to trigger the invention to re-validate the DUT parameters with the test software. The application object also contains a reference to the exec object.

A state object contains a read-only enumeration of the invention's state. The state object also contains the DUT value as a Boolean value that reflects the state of the DUT object and setting it to true will cause the invention to call the DUT change method, which may validate DUT parameters. Further, in the state object is a Boolean pause value, where it will indicate true if the user has paused a test procedure. Also, in state object is a Boolean running tests value that will indicate true if a test procedure has started but not yet finished, like between procedure initialization and procedure de-initialization states. In addition, the state object contains a button press method that is called to send a tape recorder button 301 press to the invention's state machine. The state object also contains a function that returns a string describing the passed state enumeration. State objects also contain several events that will start as the invention's state machine operates. For example, the "Begin" event starts with the button state equal to the invention state test initialization before the exec object attempts to call the test initialization for a test. Usually, the "End" event will start after test initialization is completed. An error would cause the "Canceled" event to start instead.

Test software for a specific model is packaged in a DLL file. When the test operator selects a different DUT model family, this test software DLL is de-referenced, unloaded and different test software DLL is loaded. Each invention plug-in is also a DLL and there can be multiple plug-ins loaded at one time. The data objects that are shared by test software, plug-ins and the invention are defined in a DLL file named Exec3Objects.DLL. This file contains mostly class definitions for data objects and test interfaces, and it contains little or no invention code. In other words, Exec3Objects.DLL contains the pure virtual base classes that define the interface between the Exec3 and Test Software. Actual Test Software and Plug-in classes are derived from these base classes by using Visual Basic™ IMPLEMENTS™ keyword.

FIG. 5 is a block diagram of the test system object 405 illustrating that the electronic test system 100 is hierarchical with the top tier being the procedure objects 504. The test system object 405 corresponds to a product model family file the test developer creates to test a family of specific device model numbers in a model family. The test software DLL package is typically one Visual Basic™ project and can be kept under revision control. The test software DLL file contains the list of procedure objects 504 to be run. The procedure object 504 tier is an ordered list, sequence, or script 506 of test object 508 to be run. For each test object 508, the procedure object 504 includes a collection 510 of measurement objects 512 and datapoint objects 516. The test software DLL file defines these procedure objects 504. A test operator can select a subset of a procedure object 504 to run. The electronic test system 100 runs a procedure object 504. The invention views procedure objects 504 as input data, not code. The procedure object 504 contains no significant code and can be thought of as a group of related variables, data structures, COM objects or as property-only (or code-less) Visual Basic™ classes.

A procedure object 504 is transferred from the test software DLL as a structure of COM objects. The test developer defines a procedure object 504 by writing code to build this structure of COM objects. A procedure object 504 name identifies the procedure to the test operator and contains a collection 506 of test objects 508. A procedure object 504 also contains a Boolean value that enables the procedure object 504 to be logged for calibration measurement tractability. The test software object 405 owns procedure objects 504 and they are created by the test developer-supplied code in test software initialization. The procedure object 504 contains a collection 506 of test object 508.

The second tier of the invention is the test object 508 tier. The test object 508 tier is a group of measurement objects 512 in a procedure that shares the same test algorithm and so the same test software code. To run a procedure, the invention repeatedly calls a test for each measurement and datapoint. To the invention, test objects 508 are code, not data. The test developer implements a test by adding a Visual Basic™ class module to the test software object 405. The code the test developer puts in this class should implement the test algorithm in a parameter-driven way. Then, in the procedure definition code, the test developer inserts code test software objects 405 to create an instance of this class and adds it to the procedure object 504. Test software objects 405 owns test objects 508.

The test object 508 name identifies the measurement to be performed by the test operator. The test object 508 also contains the test initialization method code, the measurement initialization method code, and the results get method code. Each test should be implemented as a separate Visual Basic™ class file and use the implements keyword to reference the test interface. The test objects contain a collection 510 of measurement object 512.

The third tier of the invention is the measurement object 512 tier. The measurement object 512 is a configuration or setup for a test object 508. Each measurement within a test object 508 can have different setup or configuration parameters. Test objects 508 are parameter-driven, and test objects 508 get their parameters from a measurement object 512.

The invention views measurement objects 512 as data to be passed from a procedure object 504 to a test object 508. The test developer defines a measurement object 512 for a test object 508 by creating a new measurement object 512 and adding it to a test object 508 in a procedure object 504. The measurement class is already defined by the invention, so the test developer needs only to create and use measurement objects 512. A measurement is also a phase of test execution. During the measurement phase of test execution, the measurement is started but data is not collected; this allows for multiple devices to be configured and triggered together.

The measurement object 512 contains a collection 518 of parameter objects 520 for one measurement and a collection 514 of datapoint objects 516 that select among multiple results from one measurement. The measurement object's 512 name identifies the measurement to the operator. The measurement object 512 also contains the name of the measurement object 512 and can be automatically generated by concatenating the description of each parameter object 516.

The fourth tier of the invention is the datapoint object 516 tier. The datapoint object 516 tier is a subset of a measurement object 512 that holds a collection 562 of parameter objects 524 that select a result when one measurement generates multiple results. One measurement may return one or more datapoints as logically makes sense to the test developer. Some examples of multiple datapoints for a measurement are minimum and maximum values of a spectrum analyzer sweep, or each channel of a device. Datapoint object 516 is also a phase of test execution. This is where the data is harvested. If it doesn't make sense to separate the measurement object 512 phase from the datapoint object harvesting phase, the test developer can write a test to do the entire measurement object 512 during this phase.

A datapoint object 516 holds the parameter objects 524 for one datapoint. This information selects specific results when a measurement generates multiple results. The name identifies the datapoint to the operator and can be blank if there is only one datapoint object 516 in the measurement. Each measurement object 512 has a collection 514 of datapoint objects 516. A datapoint object 516 holds a collection 562 of parameter objects 524 and stores a reference 526 to a specification object 528. The datapoint object 516 also contains the name of the datapoint object 516 and can be automatically generated by concatenating the description of each parameter object 524. It can be over-written by assigning a value to the name. Within each measurement, each datapoint name must be unique and cannot contain the comma character. The test software objects 405 owns datapoint objects 516.

A parameter object 524 holds one test parameter setting and it passes measurement configuration parameters from a procedure to a test. The parameter object 524 contains a Boolean value where, if it is true, the parameter will not appear in measurement and datapoint names. A parameter object 524 uses common engineering prefixes (u, m, k, M) to display values. The parameter object 524 also contains the parameter being specified, like "Frequency", and the value like "1.0E+7".

A specification object 528 contains specification limits for a result. The limit values are variant type to allow for string comparisons and to allow assignment to "Empty" to indicate one-sided specifications. The electronic test system 100 handles three sets of limits: Marginal, Production, and Customer. Marginal low and marginal high specification limits are used during manufacturing to warn when a value is close to the production limits. Production low and production high specification limits are used during manufacturing. Customer low and customer high specification limits are the customers' specification limits and are more relaxed than the production limits. A specification object 528 contains target values that are the ideal or nominal value. They may be used by analysis software to center histograms. If a target is provided when no low or high limits are provided, the invention will check measurement results for an exact match to target.

The specification object 528 also contains functions for returning the upper or lower pass/fail limit, given the type of specification. The specification object 528 contains common engineering units and a rounding format specification function. The test software objects 405 owns specification objects 528. Many datapoints can reference one specification object 528.

The invention creates a run procedure object 534 each time a procedure is started. The run procedure object 534 contains a snapshot of the invention settings and other "header" information. Plug-ins will receive these run procedure objects 534. A run procedure object 534 contains procedure "header" information. Additional information is stored in the device objects 554 and test system objects 542 it references. Each run procedure object 534 can contain operator comments. A reference to a copy of the device object 554 is made so properties of the working device object 554 can change without affecting collected results. The run procedure object 534 can also contain a counter for the number of datapoint specification failures since the start of the procedure. The run procedure object 534 contains information regarding the test operator and the procedure name.

The run procedure object 534 contains information summarizing the results of the entire run procedure, whether the values all passed, whether the results were incomplete, or whether the results failed. The run procedure object 534 contains qualification testing and the region of a qualification test profile, like "Humidity, Region 5". Also contained in the run procedure object 534 is the path and filename of the comma-separated-value (CSV) results file, the time and date the procedure was started, and the temperature and humidity of the environment of the device being tested. Also contained in the run procedure object 534 is a summary string with the above-mentioned information. Also, the run procedure object 534 contains a reference 540 to the test system object 542. The electronic test system 100 creates and owns run procedure objects 534.

Result objects 530 contain the result of one datapoint measurement. All the result objects 530 for one run procedure will reference a run procedure object 534. Often, many result objects 530 will reference the same run procedure object 534. The results object 530 contains the date and time of the result retrieved. The result object 530 contains the comparison of the value to a specification, wherein the values for this enumeration are: pass/fail unknown, pass/fail pass, pass/fail marginal, pass/fail fail, pass/fail error, pass/fail abort, pass/fail note, and pass/fail not applicable. The result object 530 is capable of returning the pass/fail property as a "pass", "fail", "unknown", "marginal", "error", "abort", "note", and "not applicable".

The result object 530 contains the name of the test, measurement and datapoint. Further contained in the result object 530 is the measured value (a variant) and its units (a string). The measured value is compared to a specification object. The result object 530 can return the value and units as a formatted string. In addition, the result object 530 can contain an optional additional measured value and its units. This value is not compared to a specification. The results object 530 also contains the property of the specification limits as a formatted string and a reference 560 to the datapoint object 516 that this result was created from. In addition, result objects 530 contain a reference 532 to the run procedure object 534 containing procedure header information. A run procedure object 534 contains a reference 536 to the DUT object 538.

A DUT object 538 contains a serial number string for the serial number of the DUT to be tested, an available Id string for an "Available Id" used during manufacturing to identify a DUT before a serial number has been assigned, a model string containing the specific model number, an option string containing the specific options, an address string containing the input and output address for the DUT to be tested, a slot string to test multiple DUTs, and a comment string for use during testing. In addition, a DUT object contains a Boolean value for default values for the above-mentioned properties, and if the Boolean value is false, the invention will load a generic form for serial numbers, addresses, etc. The DUT object 538 contains a method to implement automatic findings in response to the Boolean value being true, where the method can automatically implement DUT properties into a custom form. The DUT object 538 contains a method that will run when the operator or ActiveX™ application programming interface changes any of the DUT properties. Further, the DUT object 538 contains 544, a variant tag for the test developer's use and a more object 546 for test developer's use of additional methods and properties. The DUT object 538 is created by and owned by the test software objects 405.

A test system object 542 contains a name string containing the test system station name and an Id string that can be used to further identify the test system. The test system object 542 also contains a calibration interval numeric field that can be accessed by calibration tracking plug-ins that can use this information when a system calibration is performed. The test system object 542 contains a collection 552 of device objects 554, one for each device in the test system. In addition, the test system object 542 contains a method that the invention calls when the user clicks the "Test System" item in the invention's menu. The test system object 542 contains 548, a variant tag for test developer's use and a more object 550 for test developer's use for adding additional methods and properties. The test system object is created and owned by the test software objects 542.

The device object 554 exists for each piece of test equipment in the test system object 542. It contains a name string containing the short name of the device, a manufacturer string, a model string containing the model number, an options string, a serial number string, a maintenance number string containing the calibration maintenance number, a description string containing the device description, like "Synthesizer/Function Generator", and an address string containing the input and output address for the device. The test system device object 542 also contains a need trace Boolean value for calibration trace ability for the device and a hidden Boolean value for hiding the device from the invention's device printouts. In addition, the device object 554 contains a service due date to track when the next calibration is due. There is a Boolean value that can indicate that the equipment is missing. Further, the device object 554 contains 556, a variant tag for the test developer's use and a more object 558 for the test developer to extend the device object 554 to include input and output methods, state, etc.

A test software object 405 contains a show method that the invention will call when the operator clicks the test software item in the invention's menu. The test software object 405 contains methods that the invention calls when the test operator changes model families. Pass parameters are Exec, test system, DUT, procedures, and models. The test initialization software should create the test system 542 and DUT objects 538 for return to the invention. If the initial properties of the DUT object 538 are left blank, the invention will initialize them from persistent storage. The electronic test system 100 will display a list of available procedures by listing each test procedure 342 in the visual display 130. The lower-level objects of a procedure do not need to be created at this time. Models is a collection to which the test initialization software should add strings, one for each valid model number. These model strings will become choices in the DUT entry form.

In addition, the test software object 405 contains a procedure expand method and a procedure collapse method that the invention calls to get the details for one procedure. The test software should fill the object model for the procedure and can change the model or options of the DUT. This allows procedures to depend on the specific model and options. Further, the test software object 405 contains a procedure initialization method and a procedure de-initialization method that the invention calls when beginning a procedure and ending a procedure. The procedure initialization method is called before any plug-ins. This order allows the test system device information to be passed to a plug-in. In addition, the test software object 405 contains a result post method which is called each time the test software returns a new datapoint result to the invention, after it has been evaluated to a specification object 528. The result object 530 passed by this call contains the measurement value, units, pass/fail, etc.

Figure 6:
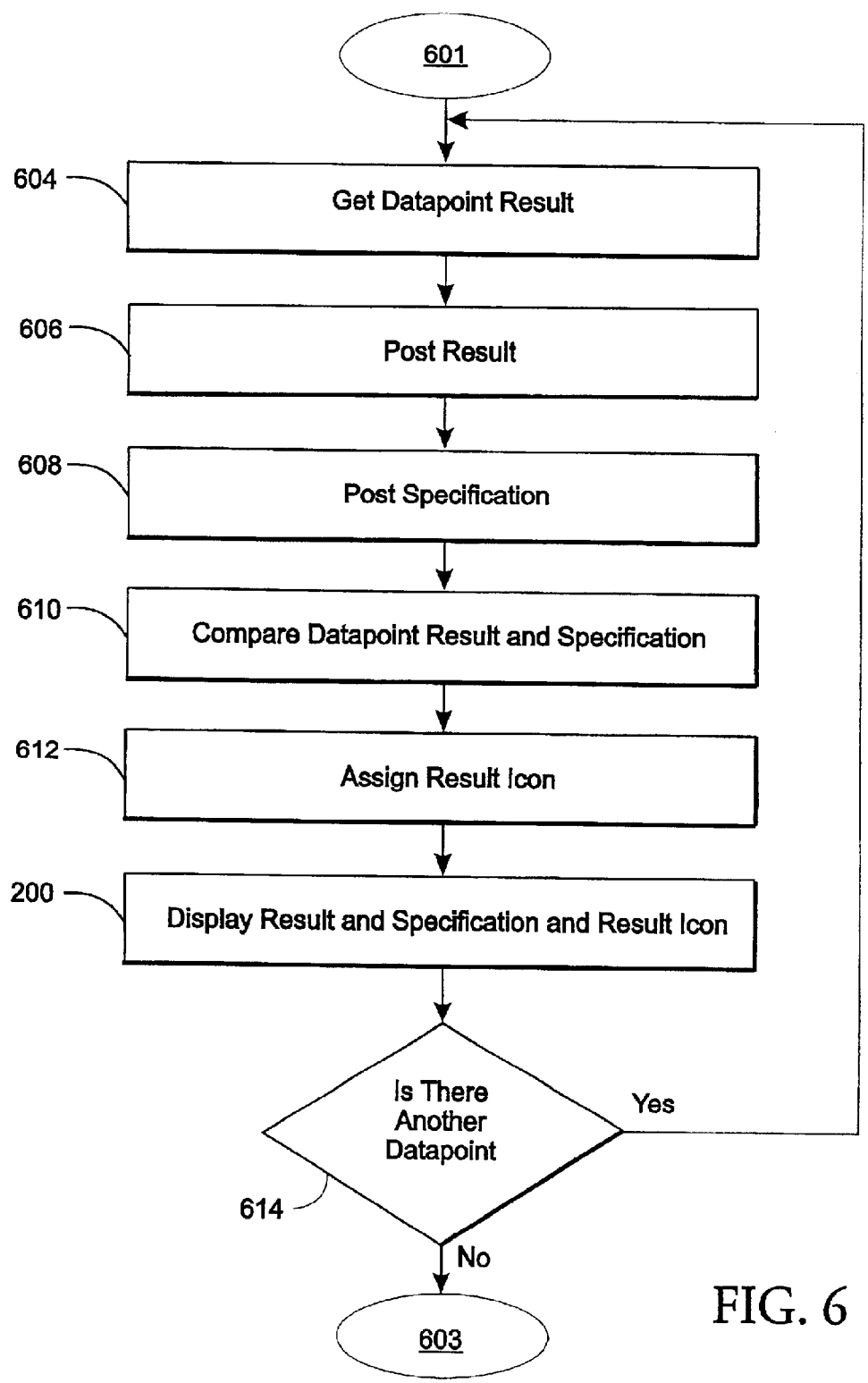
FIG. 6 is a block diagram of the datapoint and specification analysis and posting.

FIG. 6 is a block diagram of the preferred datapoint and specification analysis and posting. Once a measurement has been performed, a datapoint result 604 is returned from the DUT 208 to the test software. The test software posts the result 606 and the specification 608. The invention then compares 610 with the result 606 and the specification 608, and then assigns 612 a resulting pass/fail value in column 318 and resultant icon, such as 310, and then it sends the datapoint result 604, the specification 608, the resulting pass/fail value to be displayed in column 318, and the resultant icon, such as 310, to the visual display 130. The invention then inquires 614 whether there is another datapoint 516 in the measurement 512 to analyze. This process is repeated until there are no more datapoint results in the current measurement object 512.

Figure 7:
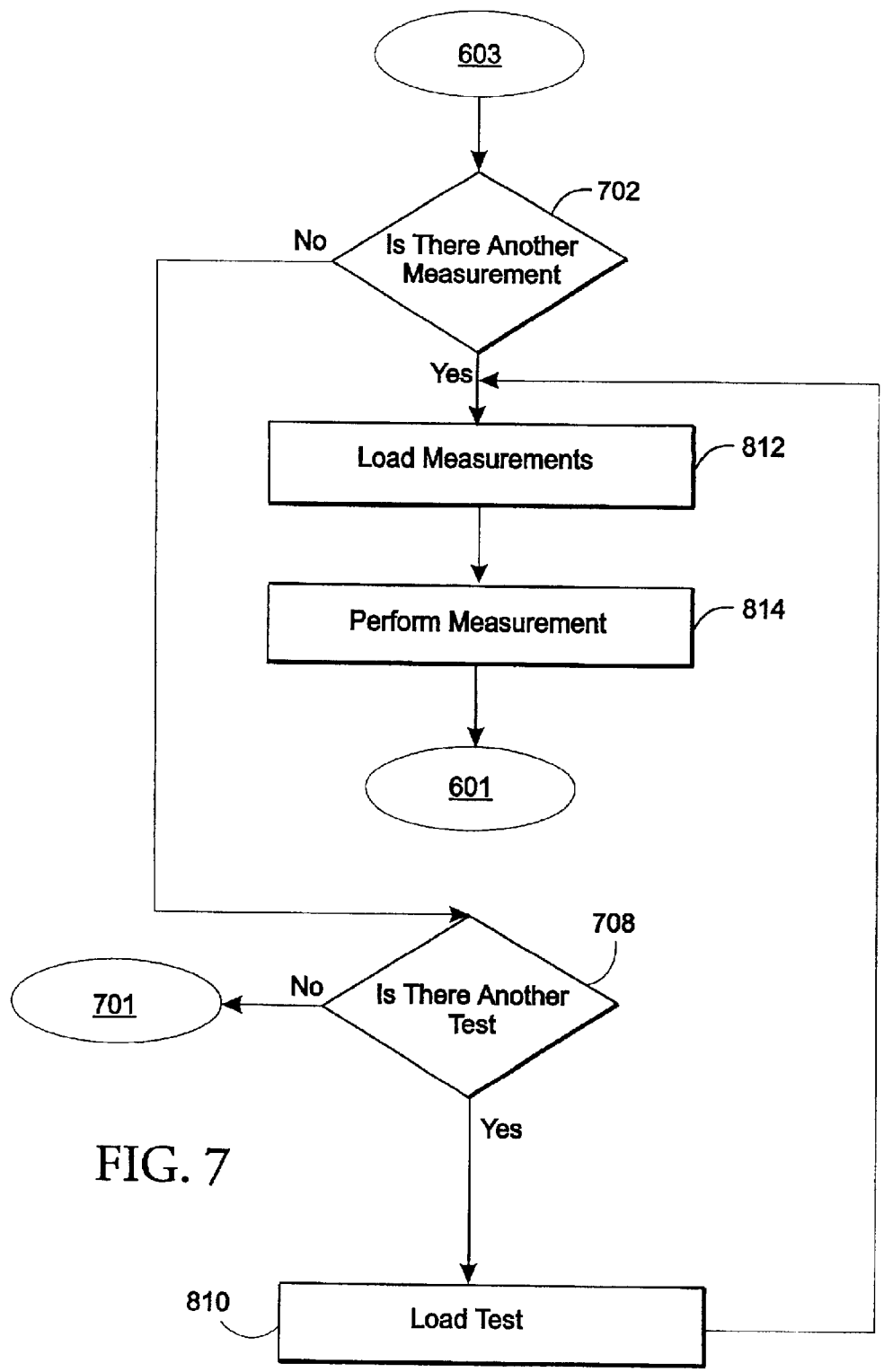
FIG. 7 is a block diagram of the measurement and datapoint process.

FIG. 7 is a block diagram of the preferred measurement and datapoint process wherein another measurement 512 is inquired 702 by the procedure. If there is another measurement 320 to be performed in the procedure, the procedure loads the measurement 812 and then it performs the measurement 814 and then the process of returning the datapoint result 601 is repeated. When the current measurement 320 has completed datapoints 702, it queries 708 whether there is another test 508 to be run. If there is another test 204 to be run, then the procedure loads the test 810 and the corresponding next measurements 812 for that test 810, and proceeds to perform the measurements 814 for that test 810.

Figure 8:
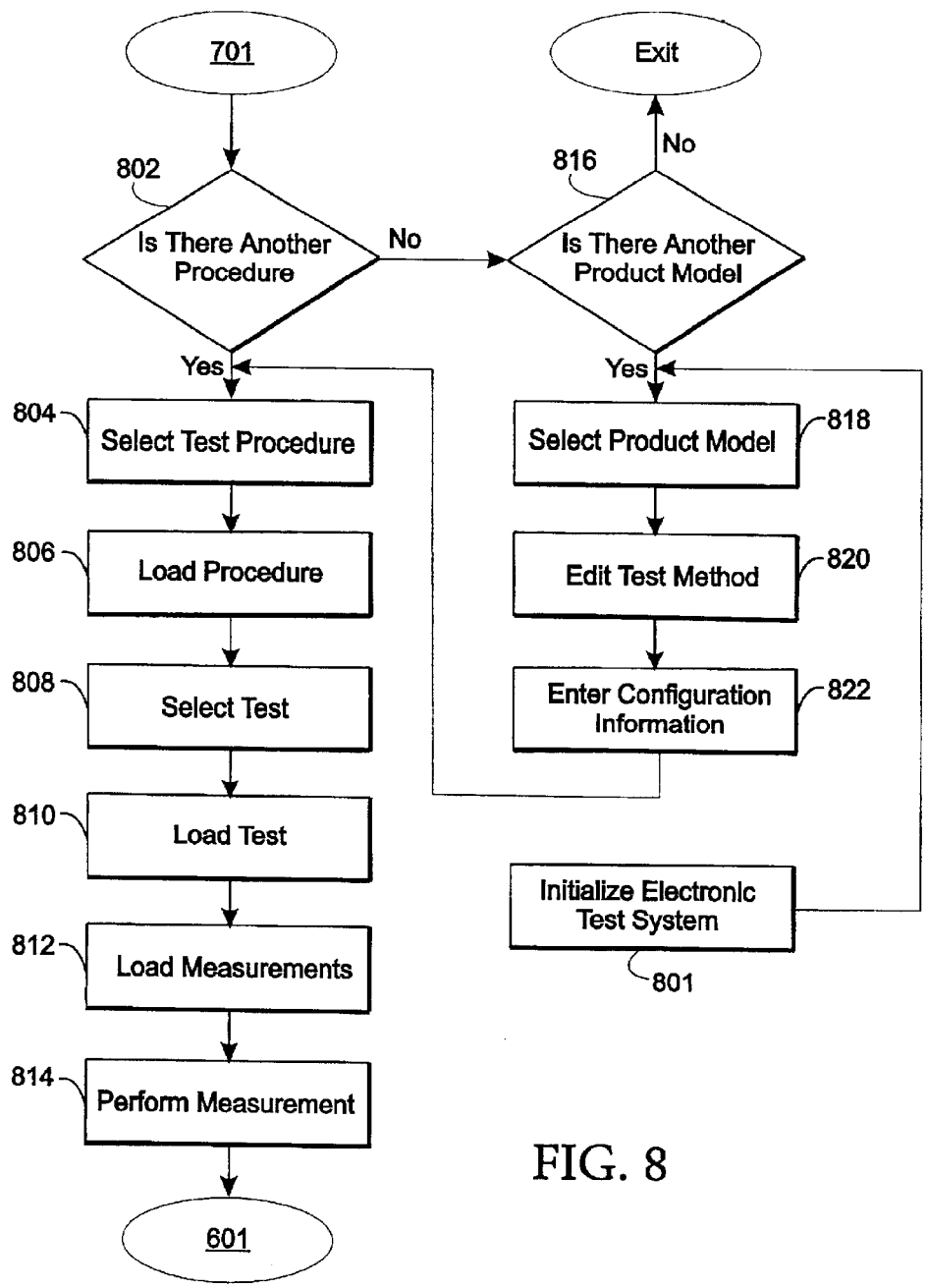
FIG. 8 is a block diagram of the test method and procedure process.

FIG. 8 is a block diagram of the preferred test method and procedure process. When the invention is started the system is initialized 801. Then the operator selects Product Model 818, test method 820, enters configuration information 822, selects test procedure 804. The invention then loads the procedure 806. The corresponding test is selected 808 and loaded 810. Then the corresponding measurements are loaded 812. The measurement is performed 814 and continued until all datapoints 516 in the measurement 512 are completed. Once the selected procedure 802 has completed and no further procedures are required to be performed, the invention inquires 816 whether there are any other product models 818 that need to be selected. If there are additional product models 818 that need to be selected, then the test operator can edit the test method 820 and enter configuration information 822 prior to selecting the test procedure 804.

It should be understood that the particular embodiments shown in the drawings and described within this specification are for purposes of example and should not be construed to limit the invention, which will be described in the claims below. Further, it is evident that those skilled in the art may now make numerous uses and modifications of the specific embodiments described, without departing from the inventive concepts. It is also evident that the steps recited may in some instances be performed in a different order; or equivalent structures and processes may be substituted for the various structures and processes described. Consequently, the invention is to be construed as embracing each and every novel feature and novel combination of features present in and/or possessed by the invention herein described.

We claim:

1. An electronic test system for testing an electronic device under test (DUT), said test system comprising:
   an electronic processor;
   an electronic memory coupled to said electronic processor;
   a hierarchical program structure residing in said memory and executed by said processor, said hierarchical program structure having multiple levels including a measurement level corresponding to a measurement to be performed on said DUT, a test level corresponding to one or more of said measurements, and a procedure level corresponding to an ordered list of said tests to be performed on said DUT.

2. An electronic test system as in claim 1 wherein said hierarchical program structure further includes a datapoint level corresponding to a single result of a measurement, and said measurement level includes a plurality of said datapoints.

3. An electronic test system for testing an electronic device under test (DUT), said test system comprising:
   an electronic processor;
   an electronic memory coupled to said electronic processor;
   a hierarchical program structure residing in said memory and executed by said processor, said hierarchical program structure having multiple levels including a measurement level corresponding to a measurement to be performed on said DUT, a test level corresponding to one or more of said measurements, and a procedure level corresponding to an ordered list of said tests to be performed on said DUT, each said level embodied in said electronic test system as a software object.

4. An electronic test system as in claim 3 wherein said hierarchical program structure further includes a datapoint level, and said measurement level corresponds to a group of said datapoints, said datapoint level embodied in said electronic test system as a datapoint software object.

5. An electronic test system as in claim 3 wherein said hierarchical program structure further includes a product model level corresponding to a set of procedures for testing a family of said DUT.

6. An electronic system as in claim 5 wherein said set of procedures in said product model level are stored in a DLL file.

7. An electronic test system as in claim 3 wherein said procedure objects comprises a structure of component object model (COM) objects.

8. An electronic test system as in claim 3 wherein said test object defines a test algorithm.

9. An electronic test system as in claim 3 wherein said test algorithm comprises one or more electronic operations defined by software code, and the electronic parameters for said electronic functions are provided by said measurement object.

10. An electronic system in claim 3 wherein said test object contains said measurement object, and said measurement object contains said datapoint object.

11. An electronic test system comprising:
    an electronic processor;
    an electronic memory coupled to said electronic processor;
    a hierarchical structure residing in the memory and executed by said processor, said hierarchical structure having multiple levels, each level embodied in the electronic test system as a function defined by a class, wherein the implementation of the function is defined by the user of the hierarchical structure by implementing the class; said classes including a measurement class corresponding to a measurement to be performed on said device, a test class corresponding to one or more related measurements, and a procedure class corresponding to an ordered list of tests to be performed on said device.

12. An electronic test system as in claim 11 wherein said hierarchical structure further includes a datapoint class linked to said measurement class.

13. An electronic test system as in claim 11 and further comprising: a test software class, the test software class defining: a test software object; a set of object methods, the set of object methods defining: an object method that displays information to a user of the apparatus, an object method that is responsive to changes in the test software and is capable of creating the procedure object, an object method capable of creating the test object, an object method capable of creating the measurement object, an object method capable of creating the datapoint object, and an object method capable of beginning and ending a selected procedure.

14. An electronic test system as in claim 11 wherein the electronic test system further comprises: a software object method capable of beginning and ending said procedure, and a software object method capable of beginning and ending said test.

15. An electronic test system as in claim 11, and further comprising a chamber driver residing in said memory, said chamber driver capable of controlling a temperature output device and a humidity output device.

16. An electronic test system as in claim 11 wherein said electronic processor further is adapted for electronically communicating with said DUT for executing said test software on said DUT and receiving a plurality of electronic outputs from said DUT corresponding to said measurement objects and said datapoint objects.

17. An electronic test system as in claim 11, and further comprising a manual input device communicating with said processor, said manual input device selected from the group consisting of a keyboard, a knob, a spin control, a mouse, a joy stick, a touch pad, and a roller ball.

18. An electronic test system as in claim 11, and further comprising plug-in software code components residing in said memory and providing an interface to other systems.

19. An electronic test system as in claim 11, and further comprising COM control interface residing in said memory permitting said test system to be initiated and monitored from other systems.

20. An electronic test system as in claim 19 wherein said COM control interface comprises an ActiveX™ COM interface.

21. A method for producing an electronic test system software program for testing an electronic device under test (DUT), said method comprising the steps of:

provinding a set of functions wherein the implementation of the functions is defined by said hierarchical structure;

implementing the functions to define said test system software program wherein said program has a hierarchical structure having multiple levels including a measurement level corresponding to a measurement to be performed on a device under test (DUT), a test level corresponding to one or more of said measurements, and a procedure level corresponding to an ordered list of said tests to be performed on said DUT, each level embodied in said program as a software object for testing said DUT;

generating said electronic test system software objects by implementing said functions; and utilizing said software objects to test said DUT.

22. A method for producing an electronic test system software program as in claim 21 wherein said hierarchical structure further includes a datapoint level which is a subset of said measurement level.

23. A computer-readable medium on which is stored a program for testing an electronic device under test (DUT), said computer program comprising:

a measurement software object corresponding to a measurement to be performed on said DUT;

a test software object defining a test algorithm utilizing parameters provided by said measurement object and corresponding to a test to be performed on said DUT;

a procedure software object corresponding to an ordered list of said tests to be performed on said DUT; and a plurality of software pointers linking said measurement object, said test object, and said procedure object in a hierarchical program structure.

24. A computer-readable medium as in claim 23, and further including a datapoint object linked to said measurement object.

* * * * *